(12) United States Patent
Yuen et al.

(10) Patent No.: US 6,174,749 B1
(45) Date of Patent: Jan. 16, 2001

(54) FABRICATION OF MULTIPLE-WAVELENGTH VERTICAL-CAVITY OPTO-ELECTRONIC DEVICE ARRAYS

(75) Inventors: Wupen Yuen, Stanford; Constance J. Chang-Hasnain, Union City; Gabriel S. Li, Daly City, all of CA (US)

(73) Assignee: The Regents of the University of California, Oakland, CA (US)

( * ) Notice: Under 35 U.S.C. 154(b), the term of this patent shall be extended for 0 days.

(21) Appl. No.: 09/078,195

(22) Filed: May 13, 1998

Related U.S. Application Data

(60) Provisional application No. 60/046,489, filed on May 14, 1998.

(51) Int. Cl.⁷ .................................................... H01L 21/00

(52) U.S. Cl. ............................................................. 438/35

(58) Field of Search ........................... 438/22, 29, 31–32, 438/34, 35, 46, 47, 57, 73, 93, 94, 507, 509, 956

(56) References Cited

U.S. PATENT DOCUMENTS

| | | | |
|---|---|---|---|
| 4,949,350 | 8/1990 | Jewell et al. | 372/45 |
| 5,029,176 | 7/1991 | Chang-Hasnain | 372/50 |
| 5,045,921 | 9/1991 | Lin et al. | 357/74 |
| 5,068,868 | 11/1991 | Deppe et al. | 372/45 |
| 5,328,854 | 7/1994 | Vakhshoori et al. | 437/24 |
| 5,351,262 | 9/1994 | Poguntke et al. | 372/102 |
| 5,365,540 | 11/1994 | Yamanaka | 372/92 |
| 5,436,192 * | 7/1995 | Epler et al. | 438/32 |
| 5,493,577 | 2/1996 | Choquette et al. | 372/46 |
| 5,648,979 | 7/1997 | Mun et al. | 372/50 |
| 5,712,865 | 1/1998 | Chow et al. | 372/96 |
| 5,737,347 | 4/1998 | Scheps et al. | 372/23 |

OTHER PUBLICATIONS

L.A. Buckman et al., "A Novel All–Optical Self–Routed Wavelength–Addressable Network (SWANET)," *IEEE Photonics Technology Letters*, vol. 7, No. 8, pp. 1066–1068 (Sep. 1995).

A. E. Willner et al., "2–D WDM Optical Interconnections Using Multiple–Wavelength VCSEL's for Simultaneous and Reconfigurable Communication Among Many Planes," *IEEE Photonics Technology Letters*, vol. 5, No. 7, pp. 838–841 (Jul. 1993).

L.F. Stokes, "Towards Wavelength Division Multiplexing," *IEEE Circuits and Devices Magazine*, vol. 12, No. 1, pp. 28–31 (Jan. 1996).

C.J. Chang–Hasnain et al., "Multiple Wavelength Tunable Surface–Emitting Laser Arrays," *IEEE Journal of Quantum Electronics*, vol. 27, No. 6, pp. 1368–1376 (Jun. 1991).

L.E. Eng et al., "Multiple–Wavelength Vertical Cavity Laser Arrays on Patterned Substrates," *IEEE Journal of Selected Topics in Quantum Electronics*, vol. 1, No. 2, pp. 624–628 (Jun. 1995).

(List continued on next page.)

*Primary Examiner*—Charles Bowers
*Assistant Examiner*—Keith Christian
(74) *Attorney, Agent, or Firm*—Townsend and Towsend and Crew LLP

(57) ABSTRACT

The present invention provides multiple-wavelength vertical-cavity surface-emitting laser ("MW-VCSEL") arrays. These arrays are fabricated in a molecular beam epitaxy system or the like using two patterned-substrate growth techniques. The growth techniques can be used with an in-situ laser reflectometry. In one embodiment, a temperature dependent growth rate to create the devices is provided. In an alternative aspect, uniform growth is performed followed by a temperature-dependent desorption technique. These techniques provided desired wavelength span and desired characteristics.

24 Claims, 6 Drawing Sheets

OTHER PUBLICATIONS

W. Yuen et al., "Multiple–Wavelength Vertical–Cavity Surface–Emitting Laser Arrays with a Record Wavelength Span," *IEEE Photonics Technology Letters*, vol. 8, No. 1, pp. 4–6 (Jan. 1996).

W. Yuen et al., "Location–Resolvable Optical Monitored Growth of Multiple–Wavelength Vertical–Cavity Laser Arrays," *Electronics Letters*, vol. 31, No. 21, pp. 1840–1842 (Oct. 1995).

F. Koyama et al., Two Dimensional Multiwavelength Surface Emitting Laser Arrays Fabricated by Nonplanar MOCVD, *Eectronics Letters*, vol. 30, No. 23, pp. 1947–1948 (Nov. 1994).

T. Wipiejewski et al., "Vertical–Cavity Surface–Emitting Laser Diodes with Post–Growth Wavelength Adjustment," *IEEE Photonics Technology Letters*, vol. 7, No. 7, pp. 727–729 (Jul. 1995).

T. Wipiejewski et al., "Multiple–Wavelength Vertical–Cavity Laser Array Employing Molecular Beam Epitaxy Regrowth," *Electronics Letters*, vol. 32, No. 4, pp. 340–342 (Feb. 1996).

H. Saito et al., "Monolithic Integration of Multiple Wavelength Vertical–Cavity Surface–Emitting Lasers by Mask Molecular Beam Epitaxy," *Appl. Phys. Lett.*, vol. 66, pp. 2466–2468 (May 1995).

H. Saito et al., "Uniform CW Operation of Multiple–Wavelength Vertical–Cavity Surface–Emitting Lasers Fabricated by Mask Molecular Beam Epitaxy," *IEEE Photonics Technology Letters*, vol. 8, No. 9, pp. 1118–1120 (Sep. 1996).

J.P. Reithmaier et al., "Gallium Desorption During Growth of (Al, Ga) As by Molecular Beam Epitaxy," *Appl. Phys. Lett.*, vol. 61, pp. 1222–1224 (Sep. 1992).

G.S. Li et al., "Accurate Molecular Beam Epitaxial Growth of Vertical–Cavity Surface–Emitting Laser Using Diode Laser Reflectometry," *Photonics Technology Letters*, vol. 7, No. 9, pp. 971–973 (Sep. 1995).

J.W. Scott et al., "High Efficiency Submilliamp Vertical Cavity Lasers with Intracavity Contacts," *IEEE Photonics Technology Letters*, vol. 6, No. 6, pp. 678–680 (Jun. 1994).

K.D. Choquette et al., "Low–Threshold Voltage Vertical–Cavity Lasers Fabricated by Selective Oxidation," *Electronics Letters*, vol. 30, No. 24, pp. 2043–2044 (Nov. 1994).

D.B. Young et al., "Enhanced Performance of Offset–Gain High–Barrier Vertical–Cavity Surface–Emitting Lasers," *IEEE Journal of Quantum Electronics*, vol. 29, No. 6, pp. 2013–2022 (Jun. 1993).

* cited by examiner

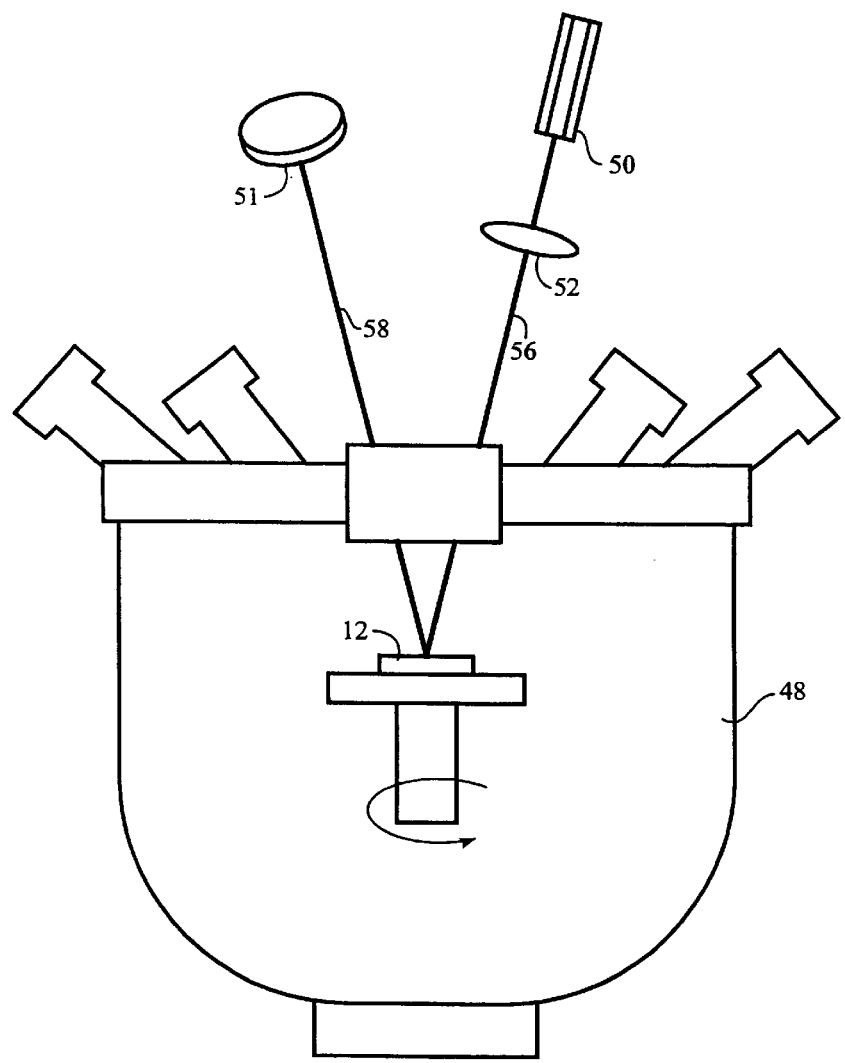
*Fig.* 6
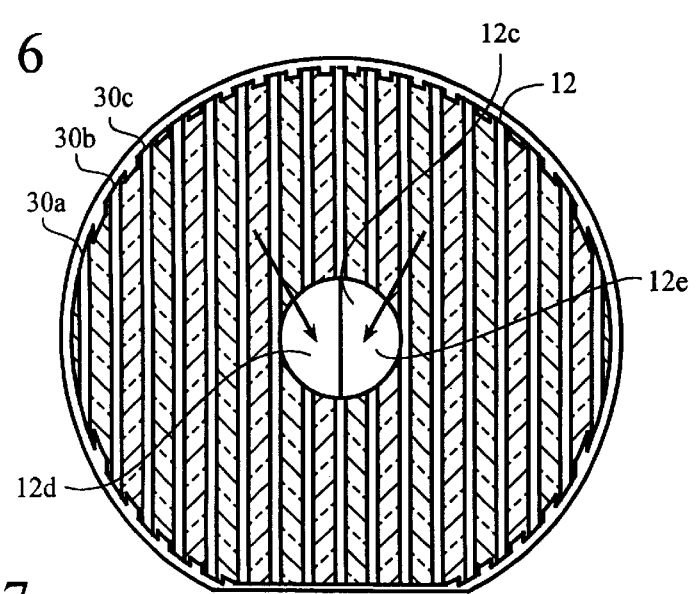
*Fig.* 7

FABRICATION OF MULTIPLE-WAVELENGTH VERTICAL-CAVITY OPTO-ELECTRONIC DEVICE ARRAYS

CROSS REFERENCE TO RELATED APPLICATIONS

This application is a nonprovisional application of U.S. provisional patent application "MULTIPLE-WAVELENGTH VERTICAL-CAVITY SURFACE-EMITTING LASER ARRAYS," U.S. Ser. No. 60/046,489, filed May 14, 1998, having Wupen Yuen and Constance J. Chang-Hasnain listed as co-inventors and assigned to The Regents of the University of California. The 60/046,489 application is hereby incorporated by reference in its entirety.

GOVERNMENT RIGHTS NOTICE

This invention was made with government support under Grant No. ONR N00014-96-1-1267 and ONR N00014-96-1-512 awarded by the Office of Naval Research, Defense Advanced Research Projects Agency (ONR/DARPA). The Government has certain rights to this invention.

BACKGROUND OF THE INVENTION

The present invention relates to the manufacture of substrates for multiple wavelength laser arrays. More particularly, the invention provides a technique including a method and device for the manufacture of multiple-wavelength vertical-cavity laser arrays by using patterned-substrate molecular beam epitaxy (MBE). Specifically, the present invention is directed toward forming a multiple wavelength laser array employing a MBE process that includes, the thermal redesorption. In other embodiments, an in-situ monitoring procedure is employed.

Vertical-cavity surface-emitting lasers (VCSELs) offer many advantages for applications in optical communications, optical interconnects, optical neural networks and optical signal processing. In the early stages of development, VCSELs were single wavelength devices. To that end, early VCSELs were typically formed by a process developed by Jewell et al. which is described in U.S. Pat. No. 4,949,350. In the process of Jewell et al., a vertical planar semiconductor structure is epitaxially grown. The semiconductor structure consists of upper and lower distributed Bragg reflectors separated by an optical distance equal to the lasing wavelength, defining a resonant cavity. An active quantum well layer is positioned in the middle of the cavity. After growth of the planar structure, an array of lasers are formed thereon by an etching process. Electrical current is passed through the selected lasers of the array causing emission of light. The surface-normal topology of VCSELs facilitates the integration of these devices as one-or two-dimensional arrays. This feature, combined with the inherent single Fabry-Perot mode operation, makes VCSELs desirable structures for wavelength division multiplexing (WDM) applications where ultrahigh bandwidth and various functionalities are required. One such application for WDM is discussed by Buckman et al. in "A novel all-optical self-routed wavelength-addressable network (SWANET)," IEEE Photon. Technol. Lett., vol. 7, no. 9, p. 1066–8, 1995 and describes the use of VCSELs as simultaneous and reconfigurable interconnects. In an article by Willner et al., "2-D WDM optical interconnects using multiple-wavelength VCSEL's for simultaneous and reconfigurable communication among many planes," IEEE Photon. Technol. Lett., vol. 5, pp. 838–841, 1993, VCSELs are described as being employed to facilitate wavelength routing. L. F. Stokes in "Towards wavelength division multiplexing," IEEE Circuits and Devices Magazine, vol. 12, no. 1, pp. 28–31, 1996 describes one advantage of using multiple-wavelength VCSEL arrays with wide channel spacings (~10 nm) to provide an inexpensive solution to increasing the capacity of local area networks without using active wavelength controls.

The demand for multiple wavelength laser arrays led to the development of a monolithic multiple-wavelength VCSELs, described by Chang-Hasnain in U.S. Pat. No. 5,029,176. The monolithic multiple-wavelength VCSELs described by Chang-Hasnain are in either a one or two dimensional arrays and are formed on a common substrate by sequential vertical growth of a lower reflector, a lower spacer, an active light emitting region and upper spacers and reflectors.

Resonant cavities are grown between the upper and lower reflectors. The optical lengths of the resonant cavities determine the lasing wavelengths. To achieve wavelength emission at multiple wavelengths, non-uniform growth of the structure over part of the substrate which defines the resonant cavity is performed. To obtain non-uniform deposition, either thermal gradients or mesas and valleys of different widths are present in the substrate.

There has been extensive efforts in controlling the parameters of resonant wavelength cavities of VCSELs. C. J. Chang-Hasnain et al. in "Multiple wavelength tunable surface-emitting laser arrays," IEEE J. Quantum Electron., vol. 27, pp. 1368–1376, 1991 discuss implementation of the intrinsic beam nonuniformity in an MBE system as being suited for controlling formation of a resonant cavity.

Control of the resonant cavity parameters has also been achieved by varying local GaAs growth rate by creating a temperature gradient on the surface of a substrate brought about by the presence of a thermally conductive pattern disposed on a side of the substrate positioned opposite to the side on which GaAs growth occurs, L. E. Eng et al., "Multiple wavelength vertical cavity laser arrays on patterned substrates," IEEE J. Select. Topics in Quantum Electron., vol. 1, pp. 624–628, 1995; W. Yuen, et al., "Multiple-wavelength vertical-cavity surface-emitting laser arrays with a record wavelength span," IEEE Photon. Technol. Lett., vol. 8, pp. 4–6, 1996; and W. Yuen, et al., "Location-resolvable optical monitored growth of multiple-wavelength vertical-cavity laser arrays," Electron. Lett., vol. 31, pp. 1840–1842, 1995.

F. Koyama et al., in "Two-dimensional multi wavelength surface emitting laser arrays fabricated by nonplanar MOCVD," Electron. Lett., vol. 30, pp. 1947–1948, 1994, describes a nonplanar MOCVD growth technique. Post-growth processing to control the resonant cavity parameters has been advocated by T. Wipiejewski et al. in "Vertical cavity surface emitting laser diodes with post-growth wavelength adjustment," IEEE Photon. Technol. Lett., vol. 7, pp. 727–729, 1995; and T. Wipiejewski et al. in "Multiple wavelength vertical-cavity laser array employing molecular beam epitaxy regrowth" Electron. Lett., vol. 32, no. 4, p. 340–342. 1996.

Still another approach for controlling the resonant cavity parameters of VCSELs involves shadow-masked MBE growth, see H. Saito, I. Ogura, Y. Sugimoto, and K. Kasahara, "Monolithic integration of multiple wavelength vertical-cavity surface-emitting lasers by mask molecular beam epitaxy," Appl. Phys. Lett., vol. 66, pp. 2466–2468, 1995; and H. Saito, I. Ogura, and Y. Sugimoto, "Uniform CW operation of multiple-wavelength vertical-cavity surface-emitting lasers fabricated by mask molecular beam epitaxy." IEEE Photon. Technol. Lett., vol. 8, no. 9, p. 1118–20, 1996. Among all these approaches, however, precise control of the wavelength selective region of the VCSEL has been difficult to achieve.

What is needed, therefore, is a growth technique which allows precise control of the wavelength selective region of a multi wavelength VCSEL.

SUMMARY OF THE INVENTION

According to the present invention, a technique including a device and method for fabricating multiple-wavelength vertical-cavity laser arrays by using patterned-substrate molecular beam epitaxy is provided. In other embodiments, the technique also includes an in-situ monitoring method using thermal redesorption. Preferably, the present method is provided in a single chamber of a molecular beam epitaxy apparatus or the like.

In a specific embodiment, the invention provides a method for fabricating a device such as multiple-wavelength vertical-cavity laser arrays on a substrate. The method includes forming a wavelength shifting layer overlying the substrate. The wavelength shifting layer has a first portion and a second portion. A step of desorbing a thickness of the first portion of the wavelength shifting layer is included. The desorbed thickness of the first portion defines a thickness difference between the first portion and the second portion of the wavelength shifting material. Alternatively, the first portion can be grown to a different thickness than the second portion using selective growing techniques. The different thicknesses of the first portion and the second portion allow for multiple-wavelength laser arrays.

In a specific embodiment, the present invention provides a multiple-wavelength vertical-cavity laser device. The device includes a substrate and an overlying wavelength shifting layer. The wavelength shifting layer has a first portion and a second portion, whereupon the first portion of the wavelength shifting material includes a first thickness and the second portion of the wavelength shifting material includes a second thickness. The first thickness is different from the second thickness. The different thicknesses of the first and second portions allow for multiple-wavelength laser arrays.

Numerous advantages are achieved by way of the present invention over pre-existing techniques. For instance, the present invention provides an easy to use technique for fabrication of multiple-wavelength laser arrays. Additionally, the present invention can be made by way of a single molecular beam epitaxial chamber, which simplifies fabrication and often improves device quality. Furthermore, the present invention provides multiple-wavelength laser arrays, which can be used for increasing capacity of local area networks and the like without using active wavelength controls. Moreover, the present invention provides an in-situ end-point detection tool for easily identifying an endpoint of selected fabrication processes. These benefits, and others will be described throughout this specification and the exhibits.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 6 is a second embodiment of the MBE apparatus, shown above in FIG. 3, employed to manufacture the wafer shown above in FIG. 1;

FIG. 7 is a top down view of the wafer shown above in FIG. 1 in accordance with an alternate embodiment;

DESCRIPTION OF A SPECIFIC EMBODIMENT

Figure 1:
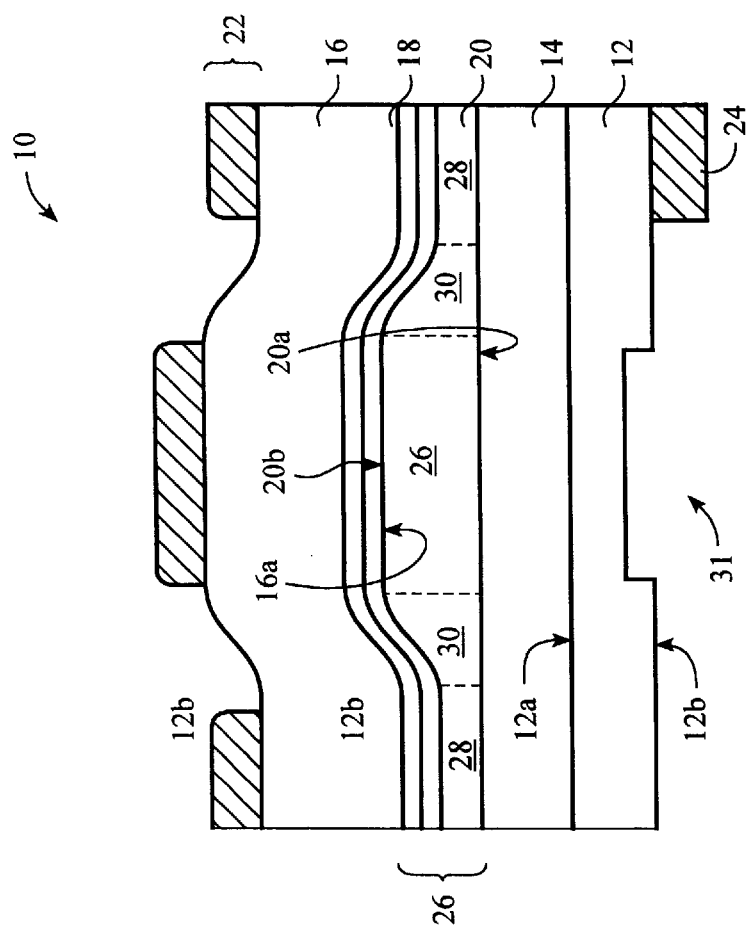
FIG. 1 is a cross-sectional view of a wafer showing two vertical cavity emitting laser arrays (VCSEL) in accordance with the present invention.

Referring to FIG. 1, an exemplary embodiment of a VCSEL 10 includes a semiconductor substrate 12 with a first reflecting layer 14 formed thereon. A second reflecting layer 16 is positioned adjacent to the first reflecting layer 14, but spaced-apart therefrom, with a quantum well region 18 and a wavelength selective layer 20 disposed therebetween. The wavelength selective layer is positioned between the quantum well region 18 and the second reflecting layer 16. A first contact layer 22 is positioned in abutting relationship with the second reflecting layer 16, forming the anode of the VCSEL 10. A second contact layer 24 is formed adjacent to the semiconductor substrate 12, defining the cathode of the VCSEL 10. Upon forward biasing of the VCSEL, by coupling the appropriate voltages to the anode 22 and the cathode 24, light is emitted therefrom.

Any type of reflecting layer may be provided so long as it is optically responsive to the wavelengths of light generated by the VCSEL. Typically, the first reflecting layer 14 is an n-type Bragg reflector formed from 35 pairs of n-type GaAs and n-type AlAs layers, having linear gradings formed thereon. The second reflecting layer 16 typically includes 21 pairs of p-type AlGaAs and p-type GaAs and one pair of p-type AlAs and p-type GaAs layers, each having parabolic gradings formed thereon. It should be understood, however, that the first reflecting layer 14 may be a p-type Bragg reflector and the second reflecting layer 16 may be an n-type Bragg reflector. The active region typically includes three InGaAs quantum wells positioned in a cavity 26 having a length measuring 1-λ with the cavity 26 being defined between the first and second reflecting layers 14 and 16. However, it is to be understood the exact number of the aforementioned layers is application dependent and the present structure is advocated to reduce the series resistance and maximize the wall-plug efficiency of the VCSEL 10.

The wavelength selective layer 20 is formed from GaAs and has a differential thickness which results in the distance between the first and second reflecting layers 14 and 16 varying. Specifically, a center portion 26 of the wavelength selective layer 20 is flanked by two thinner peripheral portions 28, with a tapered portion 30 disposed between the center portion 26 and each of the peripheral portions 28. This structure provides the wavelength selective layer 20 a planar surface 20a and non-planar surface 20b. The quantum well region 18 has a shape which is complementary to the planar surface 20b, and the surface 16a of the second reflecting layer 16 abutting the quantum well region 18 has a shape which is complementary to the non-planar surface 20b. In this fashion, the optical cavity 26 is provided with varying dimensions. Lasing action occurs in the quantum well region 18, with the wavelength emitted being dependent not only upon the thickness and composition of the quantum well region 18, but also on the length of optical cavity 26. Therefore, multiple wavelengths of light are emitted from the tapered portions 30 of the VCSEL.

Growth of the wavelength selective layer 20 is achieved by taking advantage of the dependence of GaAs growth rate on surface temperature $t_s$, in a molecular beam epitaxial (MBE) process. During the formation process of the VCSEL, the temperature of the substrate surface 12a differs spatially and temporally which provides the wavelength selective layer 20 with a varying thickness. To that end, the substrate 12 has a patterned surface 12b. Although any pattern may be provided, in the present example, the pattern includes a 200 micrometer recess 34 which is typically formed thereon, with the patterned surface 12b being heated during processing as described below.

Figure 2:
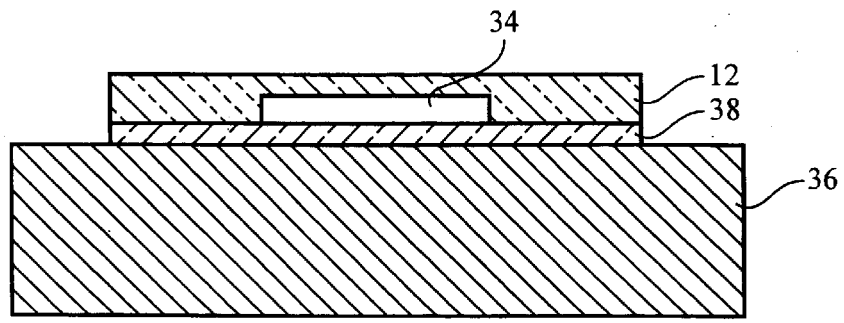
FIG. 2 is a cross sectional plan view showing a holder employed to support the substrate, shown above in FIG. 1, during fabrication of the VCSEL.

Referring to FIG. 2, the substrate 12 is in the range of 50 to 300 millimeters in diameter and is mounted to a highly thermally conductive holder 36 formed from, for example, molybdenum. The patterned surface 12b is typically formed using a conventional etching process, such as a wet etch. A layer of indium 38 is positioned between the conductive holder 36 substrate 12, forming a thermal interface 40. With this mounting assembly, the thermal communication between the substrate 34 and the holder 36 is substantially degraded in regions of the interface 40 coextensive with the recess 34 than in the remain regions.

Figure 3:
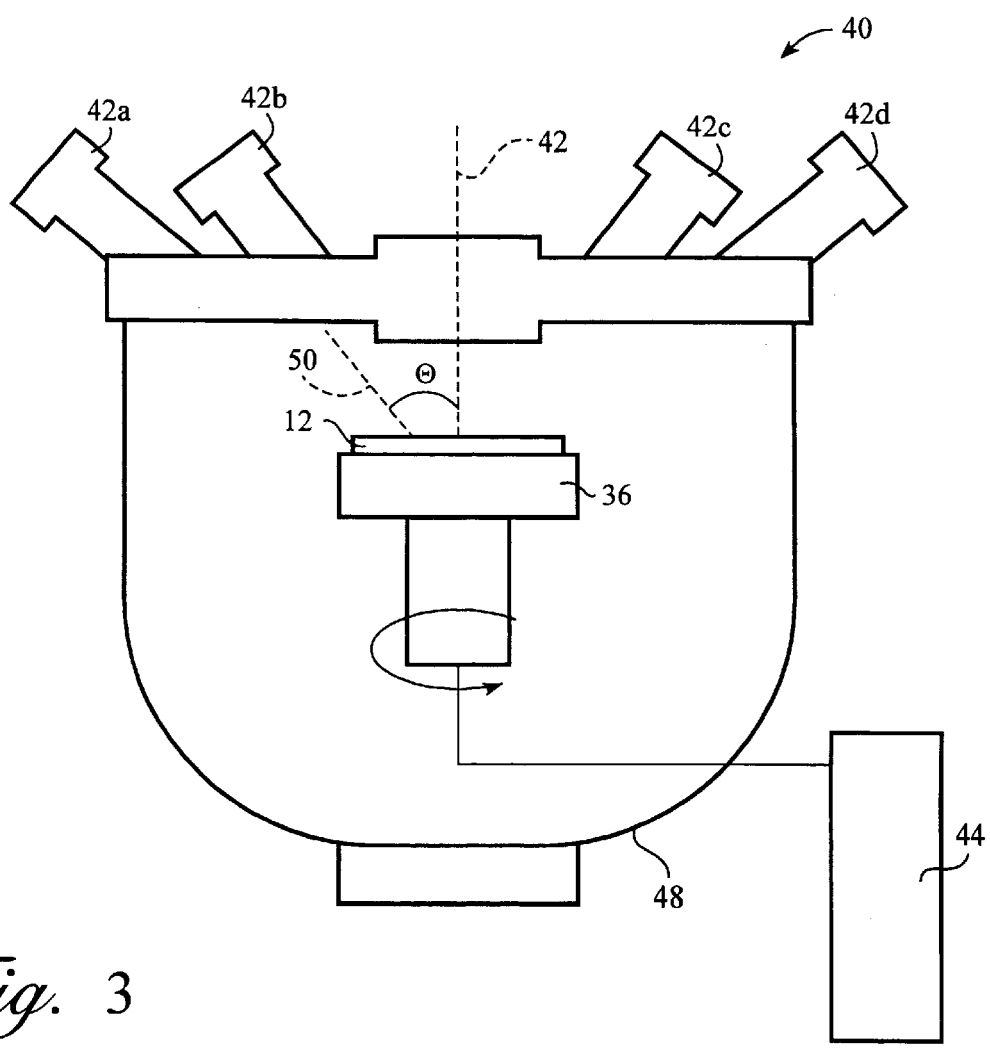
FIG. 3 is a plan view of a molecular beam epitaxy (MBE) apparatus employed to manufacture the VCSEL shown above in FIG. 1.

Referring to FIG. 3, the conductive holder 36 is typically mounted in an MBE growth chamber 42 to rotate about an axis 42 extending normal to the substrate, such as an Varian Gen-II MBE growth chamber. The growth chamber 48 includes a plurality of effusion cells 42a, 42b, 42c and 42d, each of which includes a source. The plurality of effusion cells are positioned adjacent to each other on a 33° cone surrounding the axis 42. In the present example, the sources include Al, As and Ga. A heating circuit 44 is coupled to the holder 36. A series of shutters 46 are provided within the chamber to control the effusion of dopants into the chamber 48. Each effusion cell 42a, 42b, 42c and 42d is located approximately 5 inches (12.5 cm) away from the substrate 12 with its beam 50 directed thereat and forms an angle θ with respect to axis 42. Angle θ is in the range of 20° to 40°, with 33° being preferred.

Referring to both FIGS. 1 and 3, during operation the heating circuit 44 maintains the temperature of the substrate 12 in the range of 550° C. to 600° C., and the first reflecting layer 14 is epitaxially grown while the substrate 12 is rotated at approximately 10 revolutions per minute. The thickness of the first reflecting layer 14 is approximately 1 to 3 microns, with a variation of ±0.5% over the surface 12a of the substrate 12. Thereafter, the wavelength shifting layer 20 is grown atop of the first reflecting layer 14 to a thickness which is dependent upon the desired wavelength span. Typically, the thickness is in the range of 600 to 1,000 angstroms.

Subsequent to growing the wavelength selective layer 20 to a desired thickness, growth of additional layers are terminated. The temperature of the substrate 12 is then raised to facilitate redesorption of the wavelength selective layer 20 which is coextensive with the tapered and peripheral portions 28 and 30. This is achieved by raising the temperature of the substrate holder 36 above a predetermined critical temperature at which redesorption of the GaAs occurs, typically 640° C. The presence of the recess 34 facilitates localized control of the redesorption of the wavelength selective layer 20 by creating a thermal differential on the surface 12a. This results in keeping the regions of the surface 12a, extending coextensive with the recess 34, at a lower temperature than the remaining regions of the surface 12a. It was found that by providing a thermal differential of approximately 50° C. between the two aforementioned regions, redesorption is controlled so that a greater quantity of the wavelength selective layer 20 in regions which are not coextensive with the recess 34 redesorb when compared to the remaining regions of the wavelength selective layer 20. In this fashion, the tapered portions 30 of the wavelength selective layer 20 are formed. After redesorption of the wavelength selective layer 20, the temperature of the substrate 12 is lowered so that all regions of the surface 12a are below the critical temperature, typically in the range of 550° C. to 600° C. Thereafter, the quantum well region 18 is epitaxially grown, followed by growth of the second reflecting layer 18. Thereafter the anode and 22 and cathode 26 are formed using conventional metal deposition techniques.

As applied to the laser arrays of the present invention, the flat first reflective layer 12 is substantially planar, because it is deposited when the substrate 12 is below the critical temperature. However, the wavelength selective layer 20 has a variable-thickness, because it is deposited with at least the portion of the substrate 12 being held above the critical temperature. In this fashion, the multiple wavelength laser array is defined in one or more of the tapered portions 30 with the cavity length and thus the emission wavelength varying thereacross.

Figure 4:
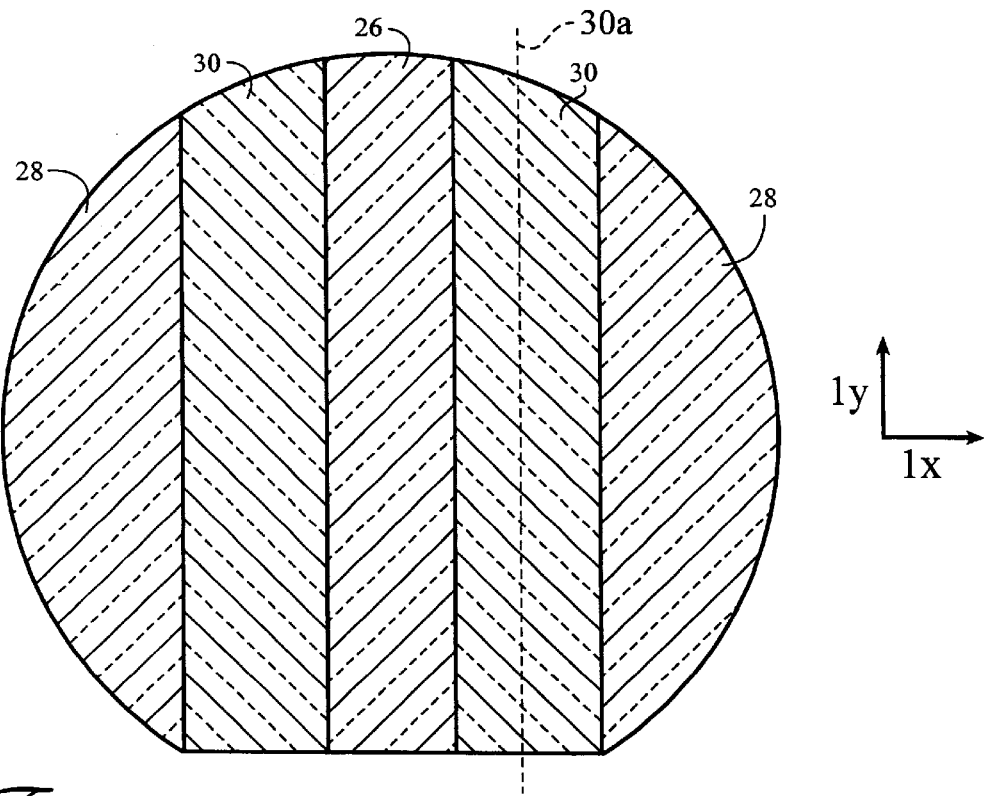
FIG. 4 is a top view of the wafer shown above in FIG. 1.
Figure 5:
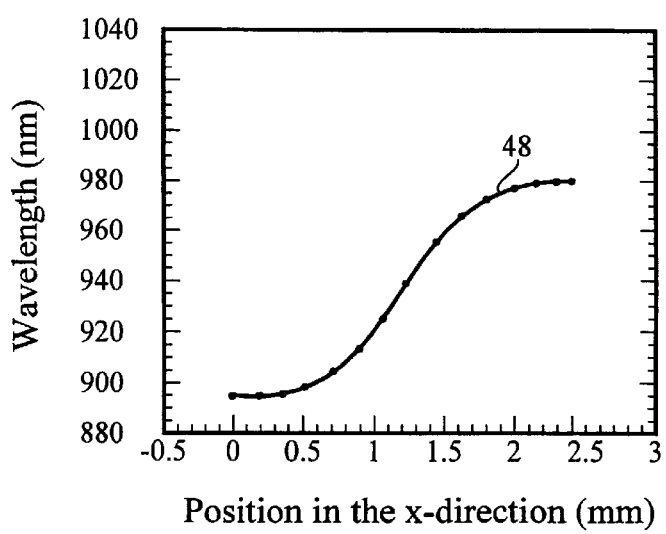
FIG. 5 is a graph showing the wavelength of light emitted from tapered portion of the wafer shown above in FIG. 1 as a function of spatial position along the tapered portion.

Referring to both FIGS. 4 and 5, the wavelengths emitted at any spatial position of the tapered portions 30 is defined as follows:

$$\lambda(x)=(\lambda_h+\lambda_c)/2+(\lambda_h-\lambda_c)/\pi\tan^{-1}(x-x_0)/\Delta x$$

where λ(x) is the wavelength emitted from tapered portions 30 as a function of the position of the tapered portion 30 along the x-direction, which is orientated transverse to a longitudinal axis 30 of the tapered portions 30. The variable $\lambda_h$ is the wavelength emitted from a portion of the wavelength selective layer 20 proximate to the 30 intersection of the tapered portion 30 with the peripheral portion 28, and $\lambda_c$ is the wavelength emitted from a portion of the wavelength selective layer 20 proximate to the intersection of the center portion 26 and the tapered portion 30. The variable $x_0$ refers to the position of the tapered portion 30 that intersects with the peripheral portion 28, and the variable x refers to the position along the tapered portion 30, as measured from $x_0$, where the wavelength is emitted. A graphical solution of the above-identified equation is shown as curve 48.

Referring to FIG. 6, an advantage with the present method of forming a VCSEL is that it allows precise control of the wavelength selective layer 20 and, therefore, the wavelengths the VCSEL will produce. One technique to achieve process control of the formation of the wavelength selective layer 20 is to employ location resolvable in-situ laser reflectometry. To that end, a beam source 50 is optically coupled to the chamber 48 of the MBE apparatus through beam shaping optics 52. A detector 51 also in optical communication with the chamber 28 and is positioned to detect light reflected from the substrate 12. With this configuration, a collimated beam 56 is directed onto different regions of the substrate 12 where the control of wavelength span is desirable, as described by G. S. Li et al. in "Accurate molecular beam epitaxy growth of vertical cavity surface emitting laser using diode laser reflectometry," IEEE Photon. Technol. Lett., vol. 9, pp. 971–973, 1995. As discussed therein, both the growth rate and thickness of a layer being epitaxially grown may be accurately monitored from sensing interference fringes on the detector 54 formed by the light 58 reflecting from layers disposed underneath the layer being grown. Typically the beam source 50 is a semiconductor laser diode emitting light having a wavelength in the range of 900 to 950 nm. High spatial resolution may be obtained, because the laser beam 56 can be focused on the substrate 12 as a spot having an area as small as 11 $m^2$. Specifically, the complete absorption of the wavelength selective layer 20 is identified by the reflecting light 58, sensed by the detector 54 no longer changing intensity due the impingement of the beam 56 on the AlAs layer monolayers.

Referring to FIG. 7, it is preferred that multiple wavelength laser arrays be formed on a given substrate. To that end, a entire substrate 12 is typically patterned to have multiple transition regions, shown as 30a, 30b and 30c. To facilitate monitoring of the redesorption, a central region 12c of the substrate 12 includes a patterned region 12d and a non-patterned region 12e. The patterned regions and the non-patterned regions have thermal characteristics substantially similar to the thermal characteristics of the remaining portions of the substrate. In this fashion, monitoring of the central region 12c allows determining the growth and redesorption rate of the remaining regions of the substrate 12.

Figure 8:
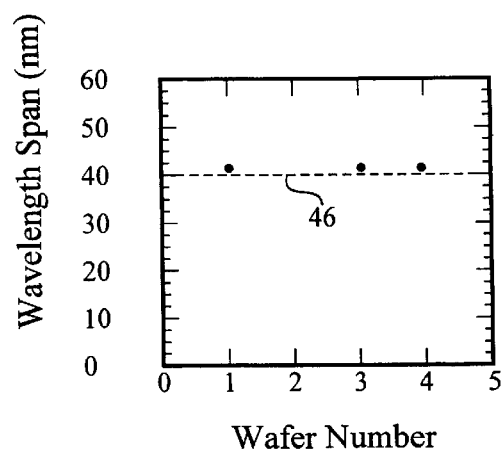
FIG. 8 is a graph comparing the wavelength span of various VCSELs formed employing the inventions discussed above with respect to FIGS. 1–6.

Referring to FIG. 8, the relative performance characteristics of multiple VCSELs formed on differing substrate employing the inventions described above in FIGS. 1–7 is shown. As shown in FIG. 8, it is seen that the three different VCSELs have wavelength spans within 1~2 nm from the designed value, indicated by line 46 as 40 mm, demonstrating the high reproducibility of this method.

Figure 9:
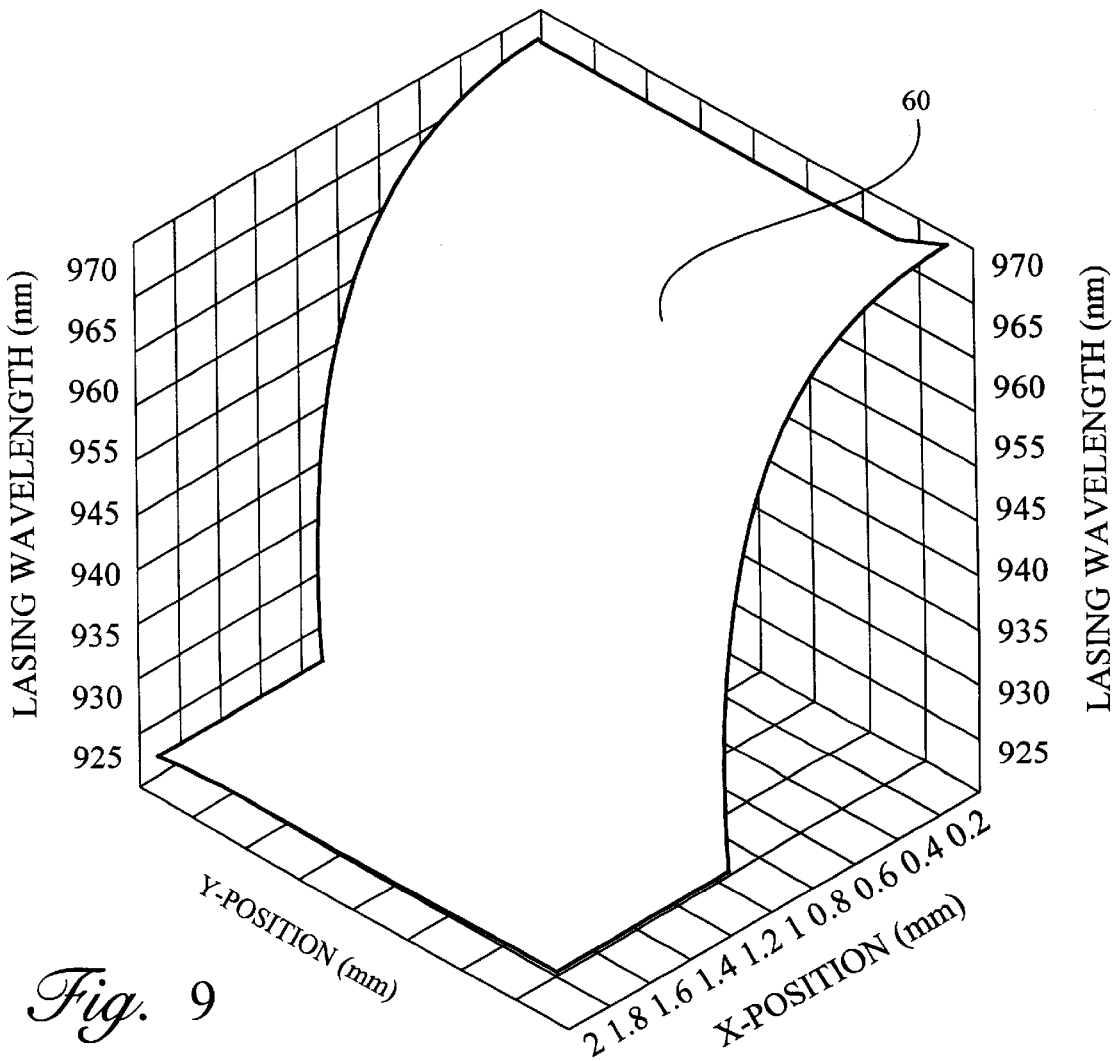
FIG. 9 is a graph showing the uniformity of emission of wavelengths of light from a VCSEL formed employing the inventions discussed above in FIGS. 1–6.

Referring to FIG. 9, the uniformity of the thermal redesorption process is demonstrated by showing the pulsed lasing wavelengths of an 11×14 array as a function of the laser position in directions both perpendicular and parallel to the longitudinal axis of the tapered portions 30. The constant wavelength distribution and parallel equal-wavelength lines, shown by curve 60 demonstrates that the redesorption process forms the wavelength selective layer 20 with high uniformity.

Figure 10:
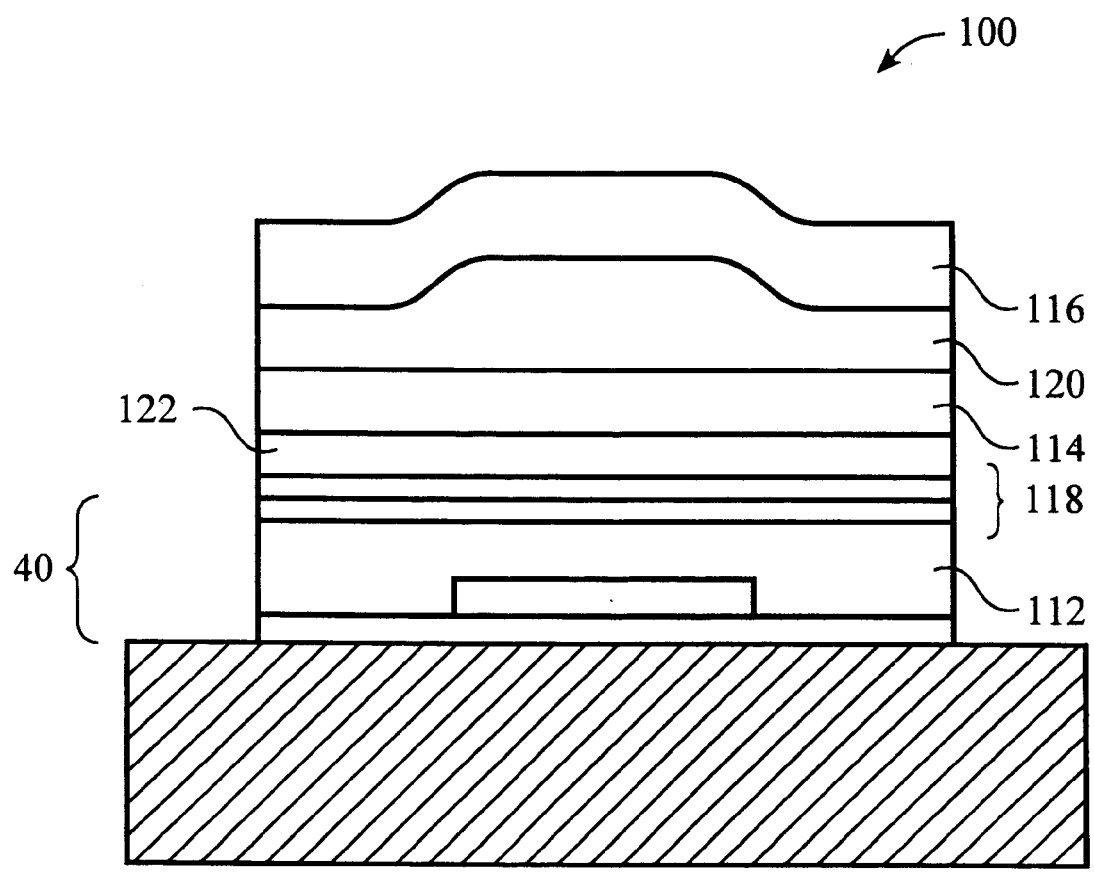
FIG. 10 is a cross-sectional view of a multi wavelength detector formed employing the inventions discussed above with respect to FIGS. 1–6.

Although the foregoing has been described with regards to the fabrication of VCSELs, the same technology may be employed to fabricate multi wavelength detector arrays. In the simplest arrangement, the multi wavelength detector may be formed by simply reverse biasing of VCSEL 10 shown in FIG. 1. However, a preferable design, shown in FIG. 10, would be to fabricate the quantum well region 118 so that a first reflecting layer 114 is positioned adjacent to the wavelength selective layer 120, with a second reflecting layer 116 disposed a top. In the exemplary embodiment of a multi wavelength detector 100 consists of a n-type substrate 112 with a quantum well region 118 formed atop thereof. Formed adjacent to the quantum well region 118 is a first reflecting layer 114 formed from multiple p-type AlGaAs and AlAs layers, with a GaAs p+contact layer 122 formed therebetween. The quantum well region 118, the first reflecting layer 114 and the p+contact layer 122 are epitaxi- ally grown in the chamber referred to above, while the substrate 112 is maintained below the critical temperature and, therefore, have substantially planar surfaces. The wavelength selective layer 120 is grown employing the redesorption process discussed above, i.e., while the substrate is heated to a temperature in excess of the critical temperature. Thereafter, the temperature of a the substrate, as well as the layer grown thereon, are reduced to a temperature below the critical temperature. The second reflecting layer, 116 is then grown atop of the wavelength selective layer 120. Instead of the quantum well 118, a bulk deposition region may be employed which could consist of one or more layers of GaAs, InGaAs, InGaAsP, InGasAsN, and the like.

While the above is a full description of the specific embodiments, such as forming a VCSEL or detector employing CVD techniques, deposition techniques may be employed such as metal organic chemical vapor deposition. In addition, the foregoing inventions may be employed to fabricate edge-emitting semiconductor lasers and modulator, a spot-size transformer or an optical waveguide. Therefore, the above description and illustrations should not be taken as limiting the scope of the present invention which is defined by the appended claims.

What is claimed is:

1. A method for fabricating a device on a substrate, said method comprising steps of:
   forming a wavelength shifting layer overlying said substrate, said wavelength shifting layer having a first portion and a second portion;
   desorbing a thickness of said first portion of said wavelength shifting layer;
   whereby said desorbed thickness of said first portion defines a thickness difference between said first portion and said second portion of said wavelength shifting material;
   wherein said thickness difference defines a region having a selected cavity mode spatial variation; and
   wherein said selected cavity mode spatial variation is provided in a multiple-wavelength vertical-cavity laser array.

2. The method of claim 1 further comprising a step of monitoring said thickness of said first portion of said wavelength shifting material.

3. The method of claim 2 wherein said monitoring step is provided by directing an energy beam using a laser to a region of said first portion and detecting a signal reflected off of said region using a sensing device, whereupon said detecting step identifies an interference effect caused by a layer of material underlying said first portion of wavelength shifting material.

4. The method of claim 1 further comprising a step of forming a first reflector layer overlying said substrate.

5. The method of claim 1 further comprising a step of forming an active region overlying said wavelength shifting material including said first portion and said second portion.

6. The method of claim 1 wherein said device is a VCSEL.

7. The method of claim 1 wherein said device is a detector.

8. The method of claim 1 wherein said forming step includes patterning said substrate.

9. The method of claim 5 further comprising a step of forming a second reflector layer overlying said active region.

10. The method of claim 4 wherein said first reflector layer is a distributed Bragg reflector.

11. The method of claim 9 wherein said second reflector layer is a distributed Bragg reflector.

12. The method of claim 1 wherein said device is a multiple-wavelength vertical-cavity laser.

13. A method for fabricating a multiple-wavelength vertical-cavity laser on a substrate, said method comprising steps of:

forming a wavelength shifting layer overlying said substrate, said wavelength shifting layer having a first portion and a second portion; and removing a thickness of said first portion of said wavelength shifting layer;

whereby a remaining thickness of said first portion defines a thickness difference between said first portion and said second portion of said wavelength shifting material.

14. The method of claim 13 wherein said thickness difference defines a region having a selected cavity mode spatial variation.

15. The method of claim 14 wherein said selected cavity mode spatial variation is provided in a multiple-wavelength vertical-cavity laser array.

16. The method of claim 13 wherein said substrate is formed from a III-V compound.

17. The method of claim 13 further comprising a step of monitoring said thickness of said first portion to said wavelength shifting material.

18. The method of claim 17 wherein said monitoring step is provided by directing an energy beam using a laser to a region of said first portion and detecting a signal reflected off of said region using a sensing device, whereupon said detecting step identifies an interference effect caused by a layer of different material underlying said first portion of wavelength shifting material.

19. The method of claim 13 further comprising a step of forming a first reflector layer overlying said substrate.

20. The method of claim 13 further comprising a step of forming an active region overlying said wavelength shifting material including said first portion and said second portion.

21. The method of claim 20 further comprising a step of forming a second reflector layer overlying said active region.

22. The method of claim 19 wherein said first reflector layer is a distributed Bragg reflector.

23. The method of claim 21 wherein said second reflector layer is a distributed Bragg reflector.

24. The method of claim 13 wherein said device is a multiple-wavelength vertical-cavity laser array.

\* \* \* \* \*